(12) United States Patent
Park et al.

(10) Patent No.: US 12,332,090 B2
(45) Date of Patent: Jun. 17, 2025

(54) MAGNETIC ANGLE SENSOR WITH SYMMETRICAL GEOMETRIC ARRANGEMENT

(71) Applicant: Infineon Technologies AG, Neubiberg (DE)

(72) Inventors: Joo Il Park, Sungnam (KR); Se Hwan Kim, Siheung (KR); Klaus Grambichler, Velden (AT); Gernot Binder, Klagenfurt (AT)

(73) Assignee: Infineon Technologies AG, Neubiberg (DE)

(*) Notice: Subject to any disclaimer, the term of this patent is extended or adjusted under 35 U.S.C. 154(b) by 188 days.

(21) Appl. No.: 18/053,821

(22) Filed: Nov. 9, 2022

(65) Prior Publication Data

US 2023/0152125 A1 May 18, 2023

(30) Foreign Application Priority Data

Nov. 16, 2021 (DE) .......................... 102021212873.4

(51) Int. Cl.
*G01D 5/14* (2006.01)
*G01B 7/30* (2006.01)
*G01D 5/16* (2006.01)

(52) U.S. Cl.
CPC .............. *G01D 5/145* (2013.01); *G01B 7/30* (2013.01); *G01D 5/16* (2013.01)

(58) Field of Classification Search
CPC .... G01R 33/09–098; G01B 7/30; G01D 5/12; G01D 5/14; G01D 5/142; G01D 5/145; G01D 5/16
See application file for complete search history.

(56) References Cited

U.S. PATENT DOCUMENTS

2005/0275399 A1* 12/2005 Kitanaka .............. G01D 5/2449
                                                                324/207.12
2011/0068780 A1*  3/2011 Sakai ..................... G01D 5/145
                                                                324/207.25

(Continued)

FOREIGN PATENT DOCUMENTS

DE        102017109972 A1    11/2017
DE        102017110197 A1    11/2017

(Continued)

OTHER PUBLICATIONS

Functional safety of electical/electronic/programmable electronic safety-related systems—Part 1: General requirements, 61508-1, VDE 0803-1 (IEC 61508-1:2010), German Version EN 61508-1:2010, Feb. 2011, 74 pages.

(Continued)

*Primary Examiner* — Huy Q Phan
*Assistant Examiner* — David B Frederiksen
(74) *Attorney, Agent, or Firm* — Harrity & Harrity, LLP

(57) ABSTRACT

The herein disclosed innovative concept concerns a magnetic angle sensor and a method for operating the same. The sensor includes a magnetoresistive arrangement and a magnetic source being configured to be movable relative to the magnetoresistive arrangement. The magnetoresistive arrangement includes a first magnetoresistive element configured to generate a first output signal, a second magnetoresistive element configured to generate a second output signal, and a third magnetoresistive element configured to generate a third output signal. The first, second and third magnetoresistive elements are oriented relative to each other such that they form a symmetrical geometric arrangement with equal angular distances between each other.

20 Claims, 13 Drawing Sheets

(56) References Cited

U.S. PATENT DOCUMENTS

| | | | | |
|---|---|---|---|---|
| 2012/0053865 A1* | 3/2012 | Saruki | ............ | G01D 5/145 |
| | | | | 702/57 |
| 2012/0249133 A1* | 10/2012 | Friedrich | ............ | G01R 33/091 |
| | | | | 324/247 |
| 2015/0066426 A1* | 3/2015 | Hirota | ............ | G01R 33/093 |
| | | | | 702/151 |
| 2016/0258781 A1* | 9/2016 | Ausserlechner | ......... | G01D 5/16 |
| 2017/0089724 A1* | 3/2017 | Mehnert | ............ | G01D 5/145 |
| 2019/0316894 A1* | 10/2019 | Hirota | ............ | G01R 33/093 |
| 2022/0196378 A1* | 6/2022 | Osabe | ............ | G01B 7/30 |

FOREIGN PATENT DOCUMENTS

| | | | |
|---|---|---|---|
| DE | 102016124948 | A1 | 6/2018 |
| DE | 102018113821 | A1 | 12/2018 |
| EP | 2302330 | A2 | 3/2011 |
| EP | 2960666 | A1 | 12/2015 |

OTHER PUBLICATIONS

Functional safety—Safety instrumented systems for the process industry sector—Part 1: Framework, definitions, system, hardware and application programming Requirements, 61511-1, VDE 0810-1 (IEC 61511-1:2016 + COR1:2016 + A1:2017), German Version EN 61511-1:2017 + A1:2017, Feb. 2019, 100 pages.
Road vehicles—Functional safety—Part 1: Vocabulary, International Standard, ISO 26262-1, Second Edition, Dec. 2018, 44 pages.

* cited by examiner new sensor with higher ASIL level
- 6 TMR stacks, 3ch ADC
- 3 differential signals
- 4 angles from 3 differential signals for safety measure
- 4 angles from 3 differential signals for application angle

MAGNETIC ANGLE SENSOR WITH SYMMETRICAL GEOMETRIC ARRANGEMENT

CROSS REFERENCE TO RELATED APPLICATION

This application claims priority to German Patent Application No. 102021212873.4 filed on Nov. 16, 2021, the content of which is incorporated by reference herein in its entirety.

TECHNICAL FIELD

Implementations of the present disclosure relate to a magnetic angle sensor comprising three magnetoresistive elements, which are oriented relative to each other such that they form a symmetrical geometric arrangement with equal angular distances between each other. By exploiting the advantages of the symmetrical geometrical arrangement, the present concept allows for a magnetic angle sensor that fulfils a certain safety integrity level (SIL) with low cost and low complexity.

BACKGROUND

Magnetic angle sensors may be used to determine a rotational angle of a magnetic source relative to a magnetic sensor. Examples for magnetic angle sensors may include hall sensors and magnetoresistive sensors, so-called xMR sensors, which exploit the magnetoresistive effect. The magnetoresistive effect describes the change in electrical resistivity of a (often ferromagnetic) material in response to an externally applied magnetic field.

In safety critical applications, the magnetic angle sensors must fulfil certain minimum safety requirements, which are internationally standardized by the International Electrotechnical Commision (IEC) in the standard IEC 61508/IEC 61511. These IEC standards defines a so-called Safety Integrity Level (SIL) using requirements grouped into two broad categories: hardware safety integrity and systematic safety integrity. A device or system must meet the requirements for both categories to achieve a given SIL. The SIL is defined as a relative level of risk-reduction provided by a safety function, or to specify a target level of risk reduction. In simple terms, SIL is a measurement of performance required for a safety instrumented function.

In some technical fields a dedicated safety integrity level was conceptualized. For example in the automotive industry the so-called ASIL (Automotive Safety Integrity Level) is an applied risk classification standard being defined by the ISO 22262, which is the Functional Safety for Road Vehicles standard. This is an adaptation of the Safety Integrity Level (SIL) used in IEC 61508 for the automotive industry. The ASIL is established by performing a risk analysis of a potential hazard by looking at the Severity, Exposure and Controllability of the vehicle operating scenario. The safety goal for that hazard in turn carries the ASIL requirements.

In the field of magnetic angle sensors, they are required to fulfil some kind of fail-safe operational requirements, which may be provided, for instance, using redundancy concepts or the like. For example, it is desirable to provide redundant signals and angle measurements with one and the same sensor. Furthermore, it is desirable that exact measurements of magnetic field components are performed even though the field strength may be very small. Magnetoresistive angle sensors may be preferred since they deliver precise measurement results even in harsh environments. However, existing magnetoresistive sensors that fulfil certain safety standards, such as one or more levels of the SIL or ASIL, may use a rather complex circuit layout which has an impact on their from factor (size) and production costs.

Thus, it would be desirable to provide magnetoresistive sensors having a simple and thus cost-effective layout, while at the same time comprising a small form factor and fulfilling requirements of certain safety standards.

This goal is achieved using the herein disclosed magnetoresistive sensor and the corresponding method for operating the magnetoresistive sensor according to the independent claims. Further implementations and advantageous aspects are suggested in the dependent claims.

According to the herein described innovative concept, a magnetic angle sensor is provided that comprises a magnetoresistive arrangement and a magnetic source being configured to be movable relative to the magnetoresistive arrangement. The magnetoresistive arrangement comprises a first magnetoresistive element configured to generate a first output signal depending on a positional relationship between the magnetic source and the first magnetoresistive element, a second magnetoresistive element configured to generate a second output signal depending on a positional relationship between the magnetic source and the second magnetoresistive element, and a third magnetoresistive element configured to generate a third output signal depending on a positional relationship between the magnetic source and the third magnetoresistive element. According to the innovative principle, the first, second and third magnetoresistive elements are oriented relative to each other such that they form a symmetrical geometric arrangement with equal angular distances between each other.

Furthermore, a method for operating such a magnetic angle sensor is provided, wherein the method comprises steps of providing a magnetoresistive arrangement with a first, second and third magnetoresistive element being oriented relative to each other such that they form a symmetrical geometric arrangement with equal angular distances between each other. The method further comprises steps of deriving from the first magnetoresistive element a first output signal (a) depending on a positional relationship between a magnetic source and the first magnetoresistive element, and deriving from the second magnetoresistive element a second output signal (b) depending on a positional relationship between the magnetic source and the second magnetoresistive element, and deriving from the third magnetoresistive element a third output signal (c) depending on a positional relationship between the magnetic source and the third magnetoresistive element. The method further comprises steps of determining three differential signals ($d_1$, $d_2$, $d_3$) from the output signals (a, b, c), wherein a first differential signal ($d_1$=b−a) is based on a difference between the first output signal (a) and the second output signal (b), a second differential signal ($d_2$=c−b) is based on a difference between the second output signal (b) and the third output signal (c), and a third differential signal ($d_3$=a−c) is based on a difference between the first output signal (a) and the third output signal (c). Furthermore, the method comprises steps of calculating at least three angle signals ($\alpha_1$, $\alpha_2$, $\alpha_3$) from the three differential signals ($d_1$, $d_2$, $d_3$), wherein each of the three angle signals ($\alpha_1$, $\alpha_2$, $\alpha_3$) represents a rotational angle of the magnetic source relative to the magnetoresistive arrangement, wherein a first angle signal ($\alpha_1$) is calculated from the first differential signal ($d_1$) and the second differential signal ($d_2$), a second angle signal ($\alpha_2$) is calculated from the second differential signal ($d_2$) and the third differential signal ($d_3$), a third angle signal ($\alpha_3$) is calculated from the first differential signal ($d_1$) and the third differential signal ($d_3$).

Furthermore, computer programs are provided, wherein each of the computer programs is configured to implement the above-described method when being executed on a computer or signal processor, so that the above-described method is implemented by one of the computer programs.

BRIEF DESCRIPTION OF THE DRAWINGS

In the following, implementations of the present disclosure are described in more detail with reference to the figures, in which.

DETAILED DESCRIPTION

Figure 1:
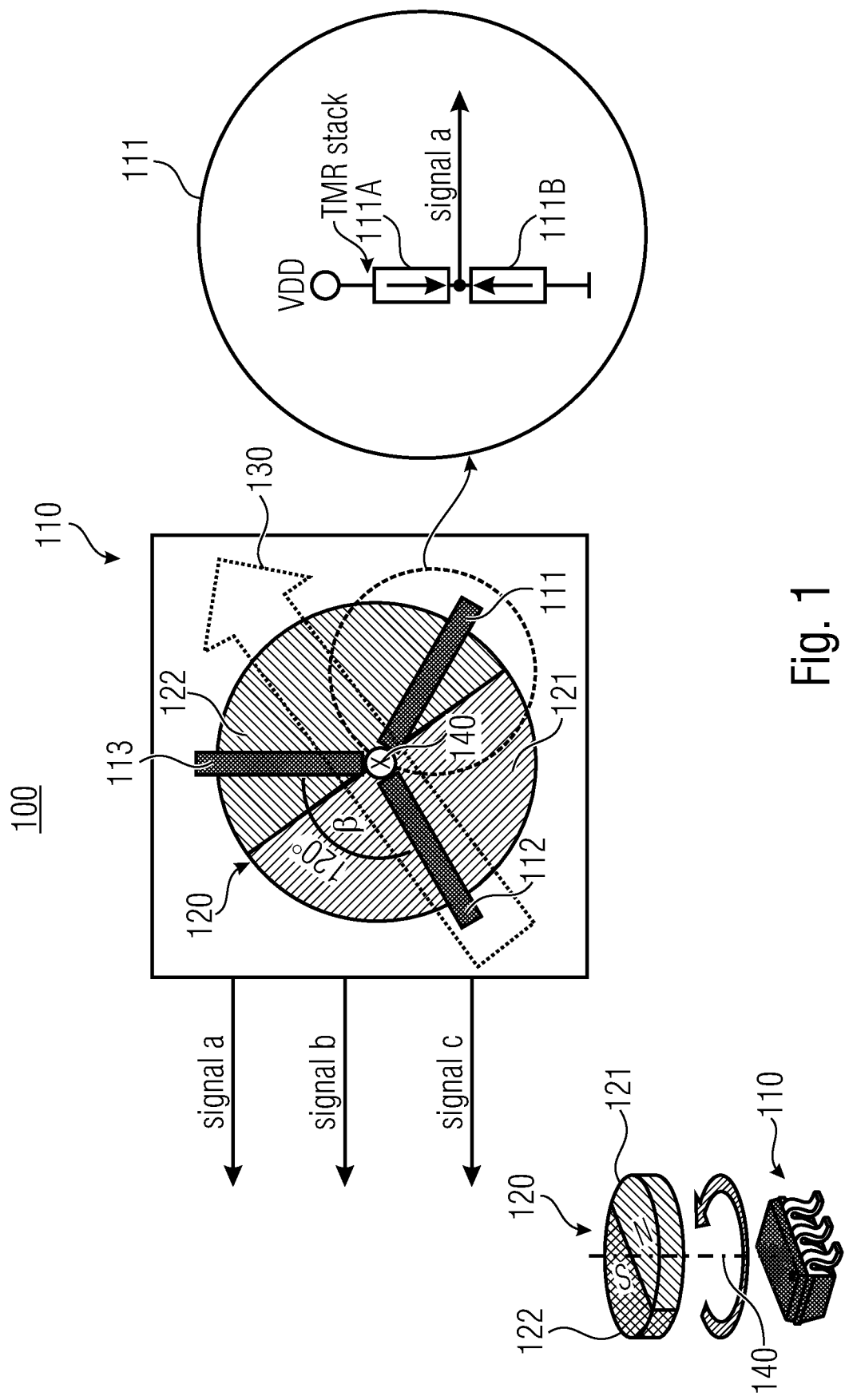
FIG. 1 shows a schematic overview of a magnetic angle sensor according to an implementation.

Equal or equivalent elements or elements with equal or equivalent functionality are denoted in the following description by equal or equivalent reference numerals.

Method steps which are depicted using a block diagram and which are described with reference to the block diagram may also be executed in an order different from the depicted and/or described order. Furthermore, method steps concerning a particular feature of a device may be replaceable with the feature of the device, and the other way around.

FIG. 1 shows a schematic view of a magnetic angle sensor 100 according to an implementation of the herein described innovative concept. The angle sensor 100 comprises a magnetoresistive arrangement 110 and a magnetic source 120 being configured to be movable relative to the magnetoresistive arrangement 110.

The magnetic source 120 may comprise a magnetic north pole 121 and a magnetic south pole 122. The magnetic source 120 may generate magnetic fields, for instance, in-plane magnetic fields (e.g. in the chip plane) as exemplarily depicted my means of arrow 130. The magnetic source 120 may move relative to the magnetoresistive arrangement 110. For example, the magnetic source 120 may rotate relative to the magnetoresistive arrangement 110, e.g. around center axis 140, as exemplarily depicted in the bottom left corner of FIG. 1.

The magnetoresistive arrangement 110 comprises a first magnetoresistive element 111 configured to generate a first output signal (a) depending on a positional relationship between the magnetic source 120 and the first magnetoresistive element 111.

The magnetoresistive arrangement 110 comprises a second magnetoresistive element 112 configured to generate a second output signal (b) depending on a positional relationship between the magnetic source 120 and the second magnetoresistive element 112.

The magnetoresistive arrangement 110 comprises a third magnetoresistive element 113 configured to generate a third output signal (c) depending on a positional relationship between the magnetic source 120 and the third magnetoresistive element 113.

According to the herein described innovative principle, the first and second and third magnetoresistive elements 111, 112, 113 are oriented relative to each other such that they form a symmetrical geometric arrangement with equal (e.g. equidistant) angular distances $\beta$ between each other. An angular distance may $\beta$ correspond to the angle $\beta$ between one of the magnetoresistive elements 111, 112, 113 and an adjacent one of the magnetoresistive elements 111, 112, 113.

As mentioned above, the geometric arrangement in which the magnetoresistive elements 111, 112, 113 are arranged is a symmetric geometric arrangement, e.g. each of the magnetoresistive elements 111, 112, 113 comprise the same angular distance $\beta$ between each other.

In the implementation shown in FIG. 1, the first, second and third magnetoresistive elements 111, 112, 113 are arranged in a symmetrical star topology with an equidistant angular distance of $\beta=120°$ between each other.

Figure 2:
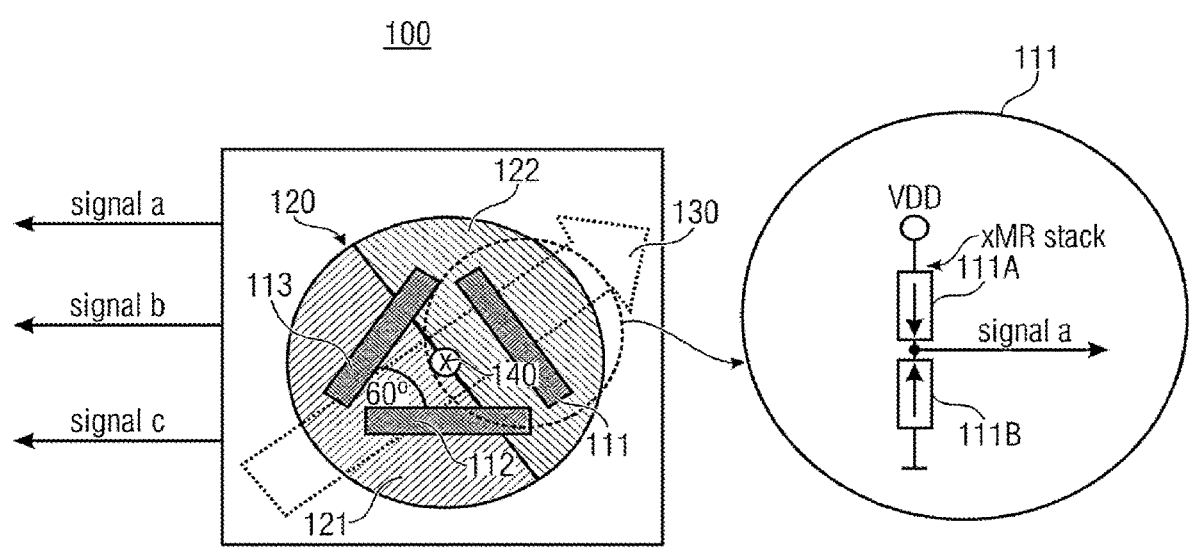
FIG. 2 shows a schematic overview of a magnetic angle sensor according to a further implementation.

FIG. 2 shows a further implementation, wherein the first, second and third magnetoresistive elements 111, 112, 113 are arranged in a symmetrical equiangular triangle arrangement with an equidistant angular distance $\beta=60°$ between each other.

Each one of the magnetoresistive elements 111, 112, 113 may comprise at least one of:
a TMR-device (TMR: Tunnel Magnetoresistance),
a GMR-device (GMR: Giant Magnetoresistance),
a CMR-device (CMR: Colossal Magnetoresistance),
an EMR-device (EMR: Extraordinary Magnetoresistance), and
an AMR-device (AMR: Anisotropic Magnetoresistance)

These magnetoresistive devices may be subsumed as so-called xMR devices. Accordingly, each one of the first, second and third magnetoresistive elements 111, 112, 113 may comprise at least one xMR device.

As exemplarily depicted in FIGS. 1 and 2, each one of the magnetoresistive elements 111, 112, 113 may comprise or may be configured as an xMR device having at least two xMR-elements 111A, 111B being connected in a bridge circuit. Thus, the xMR device may also be referred to as an xMR-stack. For example, if the xMR device may be a TMR device, the first TMR-element 111A could be a first magnetic tunnel junction (MTJ), while the second TMR-element 111B could be a second magnetic tunnel junction (MTJ). The two xMR-elements 111A, 111B may comprise antiparallel magnetizations, as exemplarily depicted using the arrows inside the respective xMR-elements 111A, 111B.

In case the xMR device was configured as an AMR device, it would show half revolution signals (180 degrees)

compared to GMR and TMR devices (360 degrees). Accordingly, an AMR device is also applicable for the herein described innovative concept with a simple divider factor of 2.

The following implementations will be described with reference to the above mentioned star topology with equidistant angular distance β=120° (FIG. 1) between the magnetoresistive elements 111, 112, 113. However, the present innovative concept is also applicable for the above mentioned equiangular triangle topology with equidistant angular distance β=60° between the magnetoresistive elements 111, 112, 113.

Figure 3:
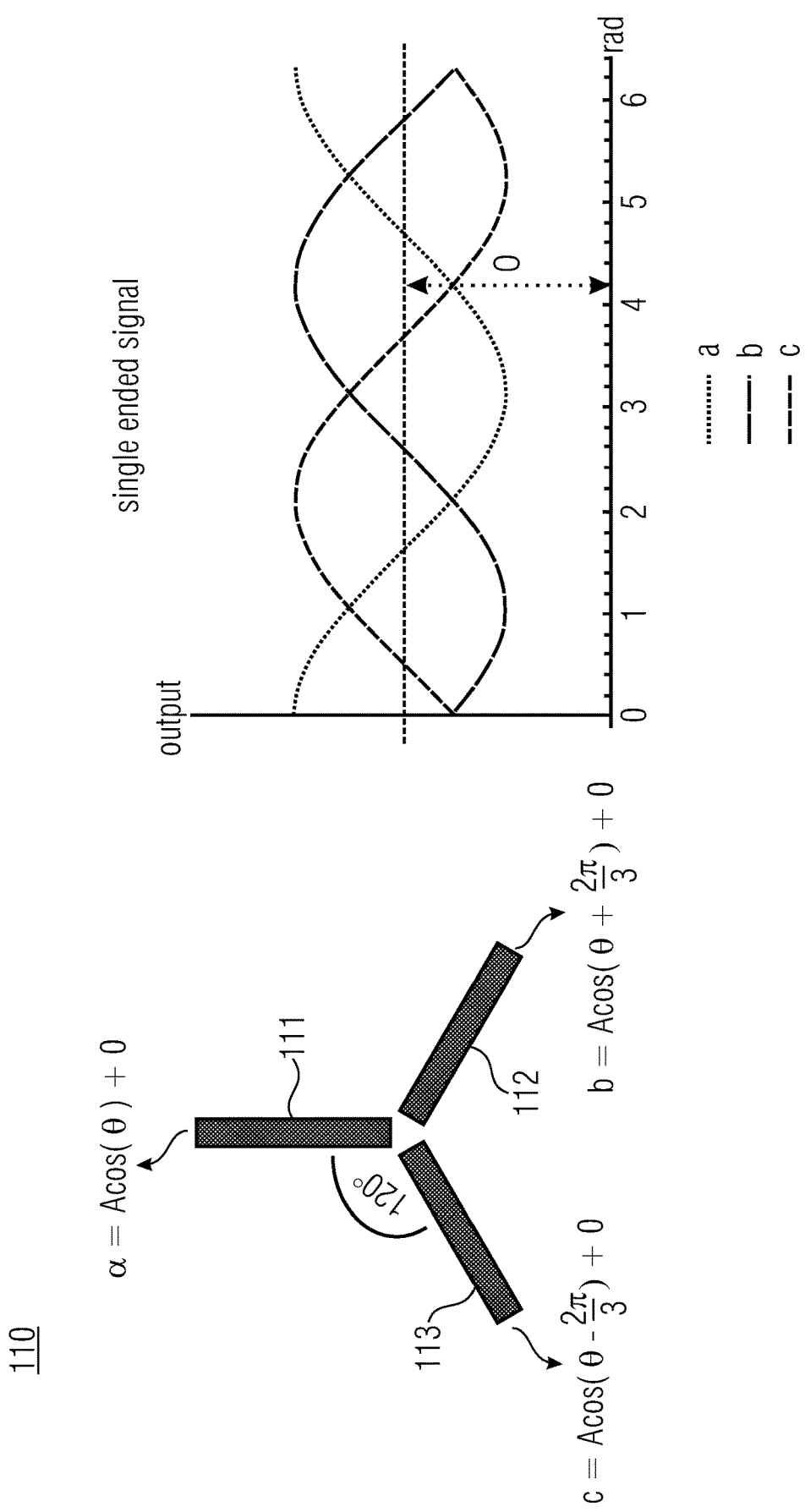
FIG. 3 shows the magnetic angle sensor of FIG. 1 in combination with a family of curves illustrating the generated single ended signals.

FIG. 3 shows the magnetoresistive arrangement 110 in the star topology comprising the first, second and third magnetoresistive elements 111, 112, 113. The magnetoresistive arrangement 110 generates three sinusoidal signals (a), (b), (c) which are phase-shifted by an amount corresponding to the angular distance β. According to the star topology, the equidistant angular distance is β=120° and, thus, the phase difference between each of the three sinusoidal signals (a), (b), (c) is Δθ=120°. For the equiangular triangle topology (FIG. 2) the equidistant angular distance is β=60° and, thus, the phase difference between each of the three sinusoidal signals (a), (b), (c) is Δθ=60°.

Each of the three sinusoidal signals (a), (b), (c) may comprise an offset "O" that may derive from homogenous magnetic disturbance fields. Accordingly, each of the three sinusoidal signals (a), (b), (c) may comprise an amplitude 'A', a phase angle θ with the above mentioned phase difference Δθ, and an offset value 'O'. Accordingly, the first magnetoresistive element 111 may generate a first signal $a = A \cdot \cos(\theta) + O$, the second magnetoresistive element 112 may generate a second signal $$b = A \cdot \cos\left(\theta + \frac{2\pi}{3}\right) + O,$$

and the third magnetoresistive element 113 may generate a third signal $$c = A \cdot \cos\left(\theta - \frac{2\pi}{3}\right) + O.$$

Since these signals (a), (b), (c) derive from one single magnetoresistive element 111, 112, 113, they are also referred to as single ended signals herein.

Figure 4:
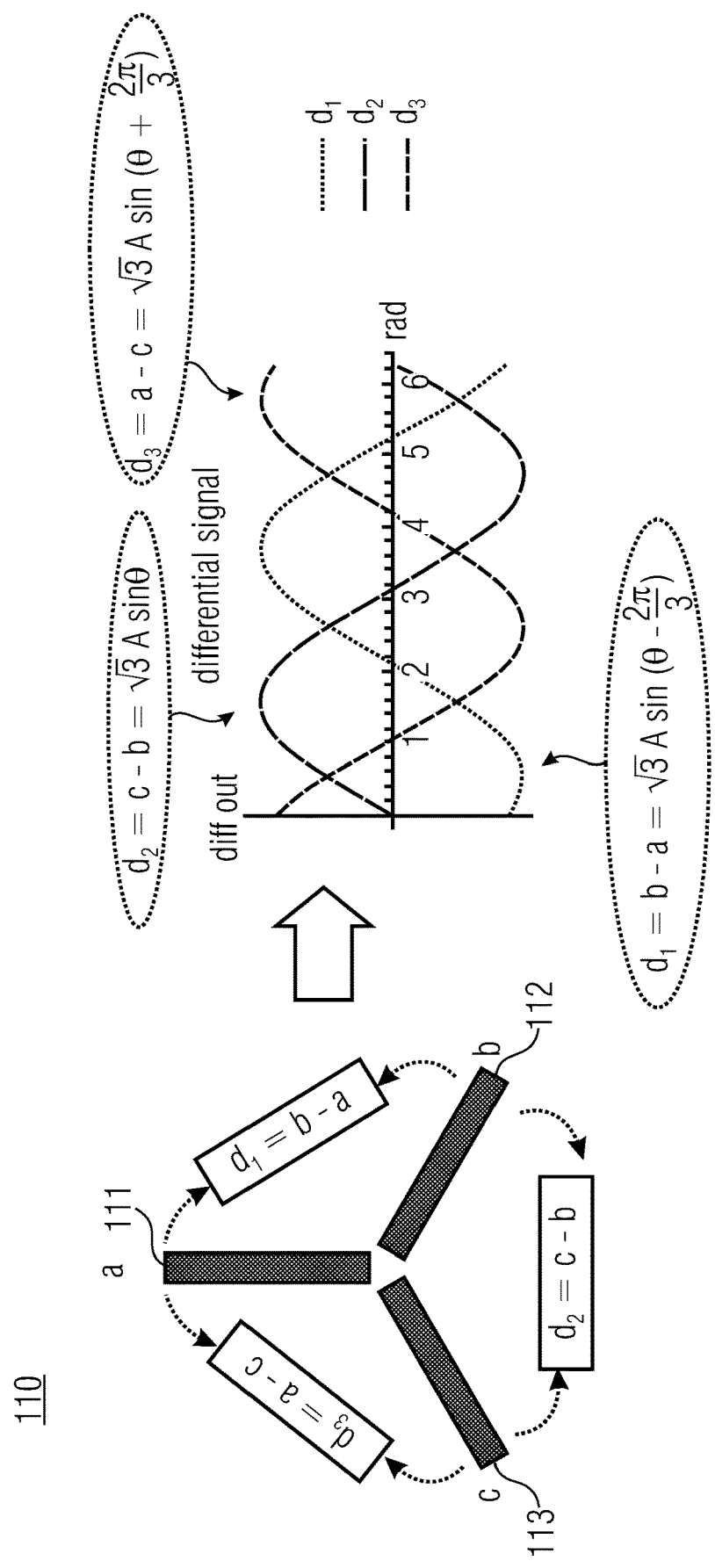
FIG. 4 shows the magnetic angle sensor of FIG. 1 in combination with a family of curves illustrating the generated differential signals.

FIG. 4 shows a further implementation. A controller (not shown), being connected to the magnetoresistive arrangement 110, may be configured to determine three differential signals from the above mentioned single ended output signals (a), (b), (c), wherein
a first differential signal $d_1$ is based on a combination of the first output signal (a) and the second output signal (b), e.g. according to: $d_1$=b−a (which would be equivalent, but with different sign, to: $d_1$=a−b),
a second differential signal $d_2$ is based on a combination of the second output signal (b) and the third output signal (c), e.g. according to: $d_2$=c−b (which would be equivalent, but with different sign, to: $d_2$=b−c), and
a third differential signal $d_3$ is based on a combination of the first output signal (a) and the third output signal (c), e.g. according to: $d_3$=a−c (which would be equivalent, but with different sign, to: $d_3$c−a).

With the above mentioned terms belonging to the single ended signals (a), (b), (c) the differential signals $d_1$, $d_2$, $d_3$ would read:

$$d_1 = b - a = \sqrt{3} A \cdot \sin\left(\theta - \frac{2\pi}{3}\right) \quad \text{(equ. 1)}$$

$$d_2 = c - b = \sqrt{3} A \cdot \sin\theta \quad \text{(equ. 2)}$$

$$d_3 = a - c = \sqrt{3} A \cdot \sin\left(\theta + \frac{2\pi}{3}\right) \quad \text{(equ. 3)}$$

As can be seen in the right part of FIG. 4, the offset 'O' cancels out, the phase difference Δθ stays the same and the amplitude 'A' increases by factor √3.

Figure 5A:
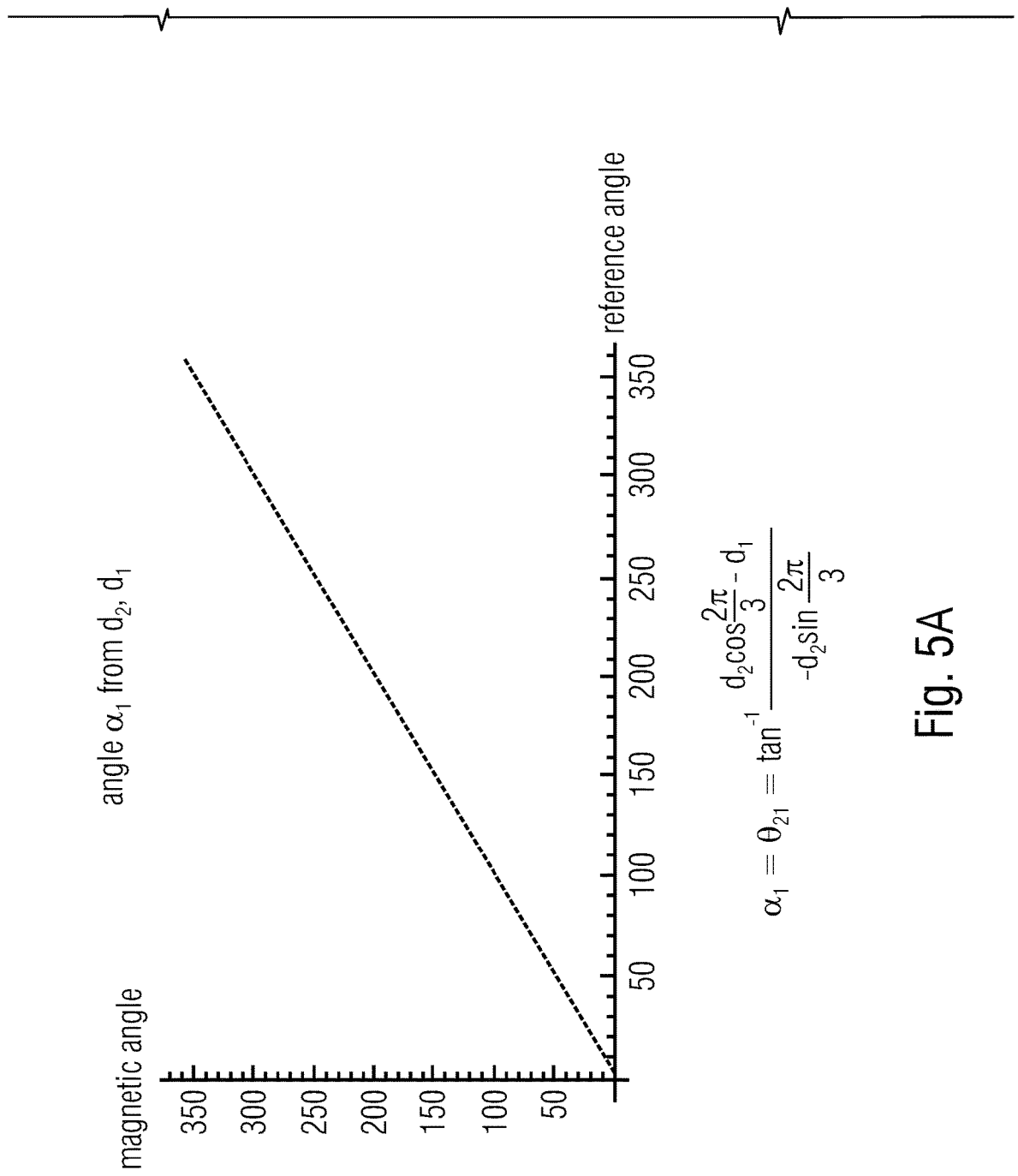
FIGS. 5A-5C show a family of curves for illustrating how the application angles may be calculated from the differential signals.
Figure 5B:
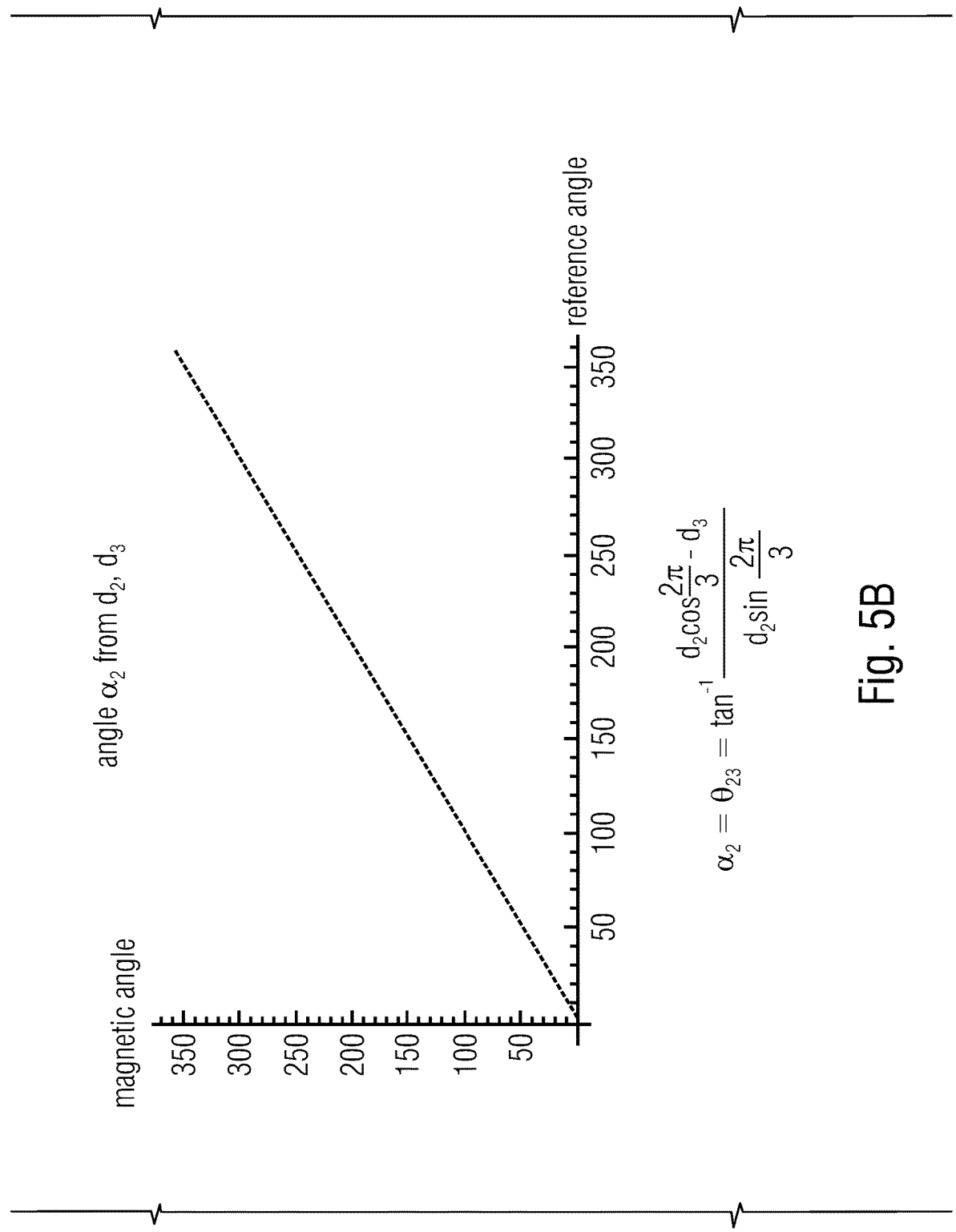
Figure 5C:
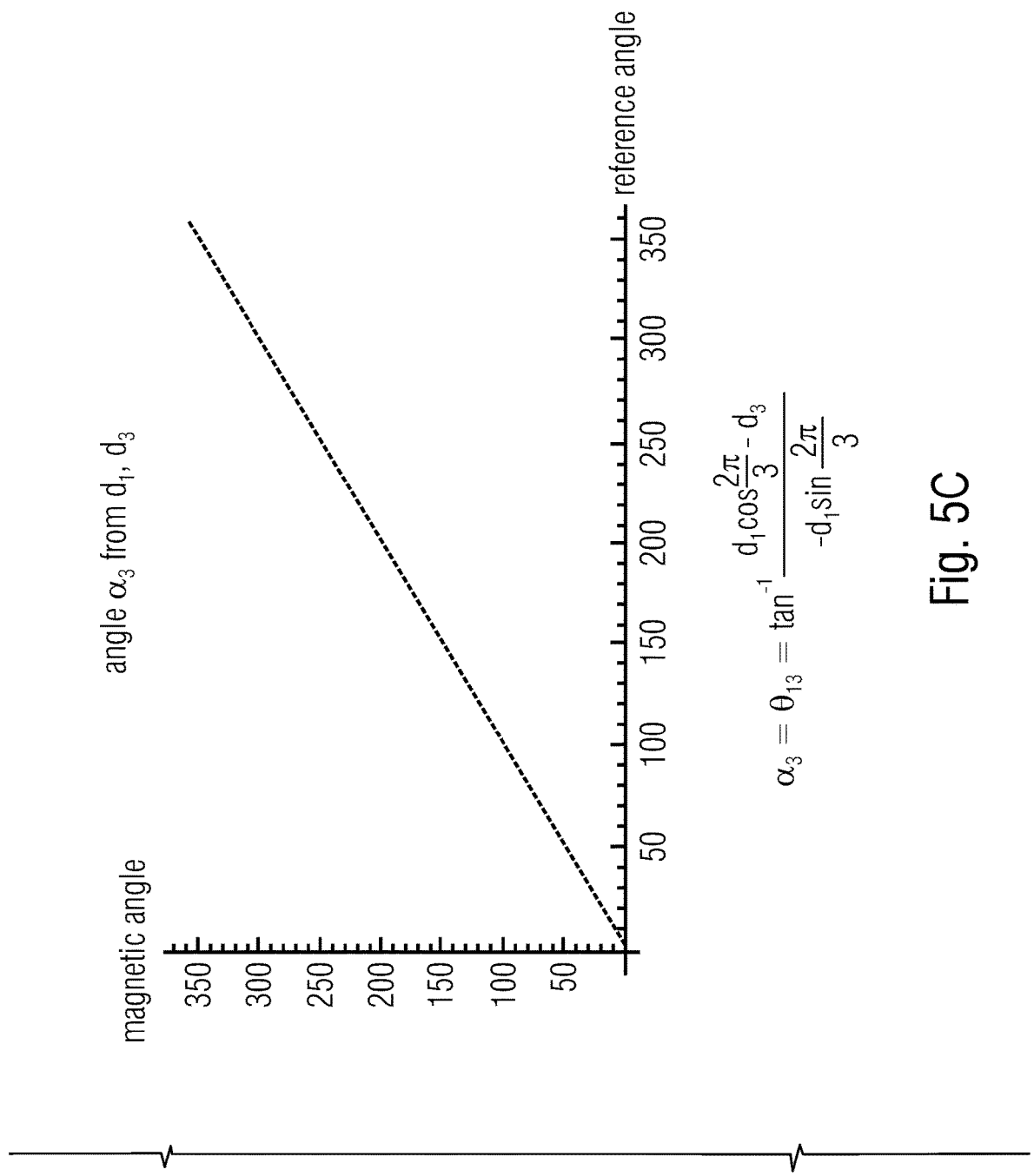

The differential signals $d_1$, $d_2$, $d_3$ may deem to calculate a rotation angle between the magnetic source 120 and the magnetoresistive arrangement 110. As can be seen in FIGS. 5A-5C, three different rotation angles $\alpha_1$, $\alpha_2$, $\alpha_3$ may be calculated from the three differential signals $d_1$, $d_2$, $d_3$ by applying the tangent (tan) function.

Thus, according to some implementations, the controller may be configured to calculate three angle signals $\alpha_1$, $\alpha_2$, $\alpha_3$ from the three differential signals $d_1$, $d_2$, $d_3$, wherein each of the angle signals $\alpha_1$, $\alpha_2$, $\alpha_3$ represents a rotational angle of the magnetic source 120 relative to the magnetoresistive arrangement 110, and wherein the controller is configured to calculate a first angle signal $\alpha_1$ from a combination of the first differential signal $d_1$ and the second differential signal $d_2$,
calculate a second angle signal $\alpha_2$ from a combination of the second differential signal $d_2$ and the third differential signal $d_3$, and
calculate a third angle signal as from a combination of the first differential signal $d_1$ and the third differential signal $d_3$.

In particular, the first angle signal $\alpha_1$ may be calculated according to the following equation:

$$\alpha_1 = \theta_{21} = \tan^{-1}\frac{d_2\cos\frac{2\pi}{3} - d_1}{-d_2\sin\frac{2\pi}{3}} \quad \text{(equ. 4)}$$

The second angle signal $\alpha_2$ may be calculated according to the following equation:

$$\alpha_2 = \theta_{23} = \tan^{-1}\frac{d_2\cos\frac{2\pi}{3} - d_3}{d_2\sin\frac{2\pi}{3}} \quad \text{(equ. 5)}$$

The third angle signal $\alpha_3$ may be calculated according to the following equation:

$$\alpha_3 = \theta_{13} = \tan^{-1}\frac{d_1\cos\frac{2\pi}{3} - d_3}{-d_1\sin\frac{2\pi}{3}} \quad \text{(equ. 6)}$$

These angle signals $\alpha_1$, $\alpha_2$, $\alpha_3$ represent the angular information that may be output by the magnetic angle sensor 100 in its respective application. Accordingly, these angle signals $\alpha_1$, $\alpha_2$, $\alpha_3$ may also be referred to as application angles.

However, in addition to calculating the application angle, the magnetic angle sensor 100 according to the herein described innovative concept may also be configured to use one or more of these application angles $\alpha_1$, $\alpha_2$, $\alpha_3$ for applying a safety mechanism or safety measure, respectively. This may be performed for checking whether the magnetic angle sensor 100 may comply with certain safety regulations, such as SIL or ASIL.

For example, the controller may be configured to conduct a safety measure based on the first, second and third angle signals $\alpha_1$, $\alpha_2$, $\alpha_3$ by comparing the first, second and third angle signals $\alpha_1$, $\alpha_2$, $\alpha_3$ with each other and to determine whether they are equal or whether they deviate from each other. Accordingly, the controller may be configured to check if:

$$\alpha_1 \approx \alpha_2 \approx \alpha_3 \qquad \text{(equ. 7)}$$

If the controller may determine that the angle signals $\alpha_1$, $\alpha_2$, $\alpha_3$ are equal, then the controller may be configured to derive that the angle calculation from all differential signals $d_1$, $d_2$, $d_3$ was executed correctly. Additionally or alternatively, the controller may be configured to derive that the calculation of the differential signals $d_1$, $d_2$, $d_3$ using the single ended signals (a), (b), (c) was correct. Yet further additionally or alternatively, the controller may be configured to derive that each of the magnetoresistive elements 111, 112, 113 may work properly and that each of the magnetoresistive elements 111, 112, 113 generated a valid signal.

It is to be noted that each of the magnetoresistive elements 111, 112, 113 generates a single ended signal (a), (b), (c) that depends on the current rotational position of the magnetic source 120 relative to the magnetoresistive arrangement 110, however, with different phase angles. That means, at every time instance, each of the magnetoresistive elements 111, 112, 113 shall provide the same signal (at least with respect to its amplitude and signal shape) but with a different phase angle, e.g. $\theta$, $\theta + \frac{2\pi}{3}$, and $\theta - \frac{2\pi}{3}$.

Accordingly, if the controller may determine that the angle signals $\alpha_1$, $\alpha_2$, $\alpha_3$ are not equal, e.g. if they may deviate from each other by a certain amount, then the controller may be configured to derive that the angle calculation from all differential signals $d_1$, $d_2$, $d_3$ was not executed correctly. The controller may be configured to derive that the calculation of the differential signals $d_1$, $d_2$, $d_3$ using the single ended signals (a), (b), (c) was incorrect. Furthermore, the controller may be configured to derive that at least one of the magnetoresistive elements 111, 112, 113 does not work properly and that at least one of the magnetoresistive elements 111, 112, 113 generated an invalid signal. Accordingly, the controller may be configured to derive that at least one of the magnetoresistive elements 111, 112, 113 may be faulty.

By comparing at least one of the angle signals $\alpha_1$, $\alpha_2$, $\alpha_3$, the differential signals $d_1$, $d_2$, $d_3$, and the single ended signals (a), (b), (c) with each other, the controller may be configured to determine which one of the magnetoresistive elements 111, 112, 113 may not work properly or may be faulty. In some implementations, the controller may be configured to generate an indication, e.g. an acoustic and/or optical alarm, for informing a user that the magnetic angle sensor 100 may be faulty and/or for informing a user which one of the magnetoresistive elements 111, 112, 113 may be faulty.

Accordingly, if the controller may determine that one of the first, second and third angle signals $\alpha_1$, $\alpha_2$, $\alpha_3$ deviates by a certain amount from the other ones, e.g. if the controller may determine that at least one of the following conditions are fulfilled $$\alpha_1 \not\approx \alpha_2 \not\approx \alpha_3 \qquad \text{(equ. 7)}$$

$$\alpha_1 \approx \alpha_2 \not\approx \alpha_3 \qquad \text{(equ. 8)}$$

$$\alpha_1 \not\approx \alpha_2 \approx \alpha_3 \qquad \text{(equ. 9)}$$

$$\alpha_1 \not\approx \alpha_3 \approx \alpha_2 \qquad \text{(equ. 10)}$$

$$\alpha_1 \approx \alpha_3 \not\approx \alpha_2 \qquad \text{(equ. 11)}$$

then the controller may be configured to detect, based on the determined deviating angle signal, that one of the first, second and third magnetoresistive elements 111, 112, 113 generates a faulty output signal, and/or which one of the first, second and third magnetoresistive elements 111, 112, 113 generates a faulty output signal.

According to the herein described innovative principle, a fourth application angle $\alpha_4$ may be calculated, in addition to the previously discussed three application angles $\alpha_1$, $\alpha_2$, $\alpha_3$. The additional fourth application angle $\alpha_4$ may also be used for safety measures to apply an even higher safety level, e.g. in terms of SIL or ASIL, for example.

Figure 6:
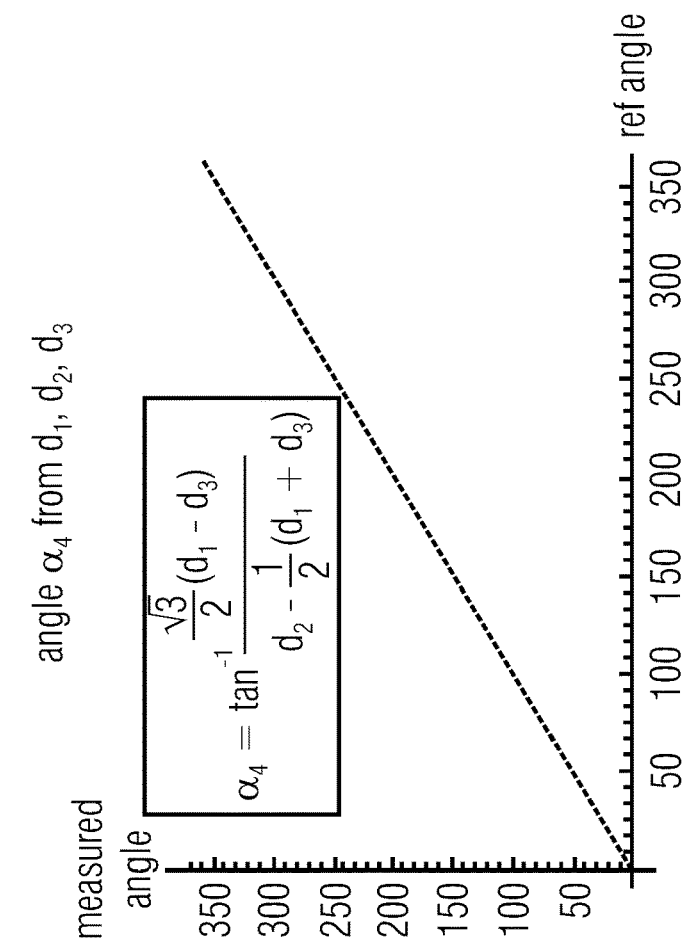
FIG. 6 shows a vector diagram for illustrating how a fourth angle signal can be calculated from the three differential signals and how a fourth application angle can be calculated.
Figure 6:
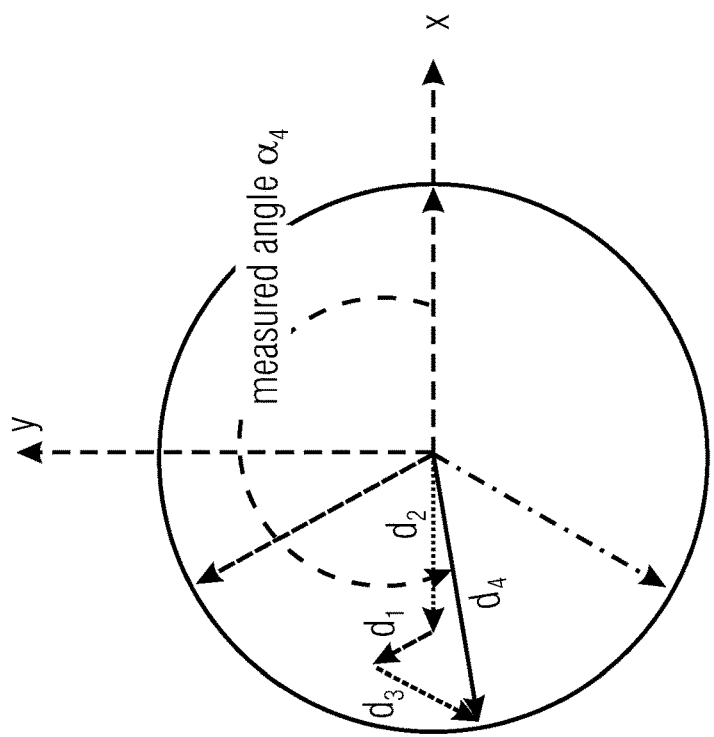

As can be seen in FIG. 6, the controller may be configured to calculate the fourth angle signal $\alpha_4$ from a combination of the first differential signal $d_1$ and the second differential signal $d_2$ and the third differential signal $d_3$. That means, that the controller may be configured to calculate the fourth angle signal $\alpha_4$ without the need for providing a fourth magnetoresistive element. Thus, according to the herein described innovative concept, exactly three magnetoresistive elements 111, 112, 113 may be sufficient in order to calculate four different angle signals $\alpha_1$, $\alpha_2$, $\alpha_3$, $\alpha_4$ that may be used as application angles and for performing a safety measure.

The controller may be configured to calculate the fourth angle signal $\alpha_4$ from the first, second and third differential signals $d_1$, $d_2$, $d_3$ according to the following equation:

$$\alpha_4 = \tan^{-1} \frac{\frac{\sqrt{3}}{2}(d_1 - d_3)}{d_2 - \frac{1}{2}(d_1 + d_3)} \qquad \text{(equ. 12)}$$

The representation on the left side in FIG. 6 shows a vector diagram for illustrating the calculation of the fourth angle signal $\alpha_4$ based on the three differential signals $d_1$, $d_2$ and $d_3$. According to the vector diagram, the rotating vector of the differential signal $d_4$ is the sum of the rotating vectors of the differential signals $d_1$, $d_2$ and $d_3$: The corresponding phase angle $\alpha_4$ may be calculated according to equation 12.

In some implementations, the controller may be configured to use one or more of these four application angles $\alpha_1$, $\alpha_2$, $\alpha_3$, $\alpha_4$ for applying a safety mechanism or safety measure, respectively. This may be performed for checking whether the magnetic angle sensor 100 may comply with certain safety regulations, such as SIL or ASIL.

For example, the controller may be configured to conduct a safety measure based on the first, second, third and fourth angle signals $\alpha_1$, $\alpha_2$, $\alpha_3$, $\alpha_4$ by comparing the first, second, third and fourth angle signals $\alpha_1$, $\alpha_2$, $\alpha_3$, $\alpha_4$ with each other and to determine whether they are equal or whether they deviate from each other. Accordingly, the controller may be configured to check if:

$$\alpha_1 \approx \alpha_2 \approx \alpha_3 \approx \alpha_4 \qquad \text{(equ. 13)}$$

If the controller may determine that the angle signals $\alpha_1$, $\alpha_2$, $\alpha_3$, $\alpha_4$ are equal, then the controller may be configured to derive that the angle calculation of the four angle signals $\alpha_1$, $\alpha_2$, $\alpha_3$, $\alpha_4$ from the three differential signals $d_1$, $d_2$, $d_3$ was executed correctly. Additionally or alternatively, the controller may be configured to derive that the calculation of the differential signals $d_1$, $d_2$, $d_3$ using the single ended signals (a), (b), (c) was correct. Yet further additionally or alternatively, the controller may be configured to derive that each of the magnetoresistive elements 111, 112, 113 may work properly and that each of the magnetoresistive elements 111, 112, 113 generated a valid signal.

In turn, if the controller may determine that the angle signals $\alpha_1$, $\alpha_2$, $\alpha_3$ are not equal, e.g. if they may deviate from each other by a certain amount, then the controller may be configured to derive that the angle calculation of the four angle signals $\alpha_1$, $\alpha_2$, $\alpha_3$, $\alpha_4$ from the three differential signals $d_1$, $d_2$, $d_3$ was not executed correctly. The controller may be configured to derive that the calculation of the differential signals $d_1$, $d_2$, $d_3$ using the single ended signals (a), (b), (c) was incorrect. Furthermore, the controller may be configured to derive that at least one of the magnetoresistive elements 111, 112, 113 does not work properly and that at least one of the magnetoresistive elements 111, 112, 113 generated an invalid signal. Accordingly, the controller may be configured to derive that at least one of the magnetoresistive elements 111, 112, 113 may be faulty.

By comparing at least one of the angle signals $\alpha_1$, $\alpha_2$, $\alpha_3$, $\alpha_4$, the differential signals $d_1$, $d_2$, $d_3$, and the single ended signals (a), (b), (c) with each other, the controller may be configured to determine which one of the magnetoresistive elements 111, 112, 113 may not work properly or may be faulty. In some implementations, the controller may be configured to generate an indication, e.g. an acoustic and/or optical alarm, for informing a user that the magnetic angle sensor 100 may be faulty and/or for informing a user which one of the magnetoresistive elements 111, 112, 113 may be faulty.

Accordingly, if the controller may determine that one of the first, second, third and fourth angle signals $\alpha_1$, $\alpha_2$, $\alpha_3$, $\alpha_4$ deviates by a certain amount from the other ones, then the controller may be configured to detect, based on the determined deviating angle signal, that one of the first, second and third magnetoresistive elements 111, 112, 113 generates a faulty output signal, and/or which one of the first, second and third magnetoresistive elements 111, 112, 113 generates a faulty output signal.

Additionally or alternatively to the above mentioned calculation of the four angle signals $\alpha_1$, $\alpha_2$, $\alpha_3$, $\alpha_4$ from the three differential signals $d_1$, $d_2$, $d_3$ for safety reasons, the controller may be configured to increase/enhance the safety level by performing a further safety integrity double-check verification according to the following equation:

$$\left(\frac{\sqrt{3}}{2}(d_1 - d_3)\right)^2 + \left(d_2 - \frac{1}{2}(d_1 + d_3)\right)^2 \approx \text{constant} \qquad \text{(equ. 14)}$$

According to above equation 14, the controller may be configured to conduct a safety measure based on the first, second and third differential signals $d_1$, $d_2$, $d_3$ by checking whether a sum of a first quadratic term containing the first and third differential signals $d_1$, $d_3$ and a second quadratic term containing the first and second and third differential signals $d_1$, $d_2$, $d_3$ is constant.

The first quadratic term $$\left(\frac{\sqrt{3}}{2}(d_1 - d_3)\right)^2$$

may correspond to the $\cos^2$ of the fourth angle signal $\alpha_4$, while the second quadratic term $$\left(d_2 - \frac{1}{2}(d_1 + d_3)\right)^2$$

may correspond to the $\sin^2$ of the fourth angle signal $\alpha_4$. Accordingly, based on the fourth angle signal $\alpha_4$ it may be checked whether the criterion $\cos^2\alpha_4 + \sin^2\alpha_4 = 1$ is fulfilled.

If the controller may determine that the criterion according to equation 14 is fulfilled, then the controller may be configured to derive that the angle calculation of the four angle signals $\alpha_1$, $\alpha_2$, $\alpha_3$, $\alpha_4$ from the three differential signals $d_1$, $d_2$, $d_3$ was executed correctly. Additionally or alternatively, the controller may be configured to derive that the calculation of the differential signals $d_1$, $d_2$, $d_3$ using the single ended signals (a), (b), (c) was correct. Yet further additionally or alternatively, the controller may be configured to derive that each of the magnetoresistive elements 111, 112, 113 may work properly and that each of the magnetoresistive elements 111, 112, 113 generated a valid signal.

Figure 7:
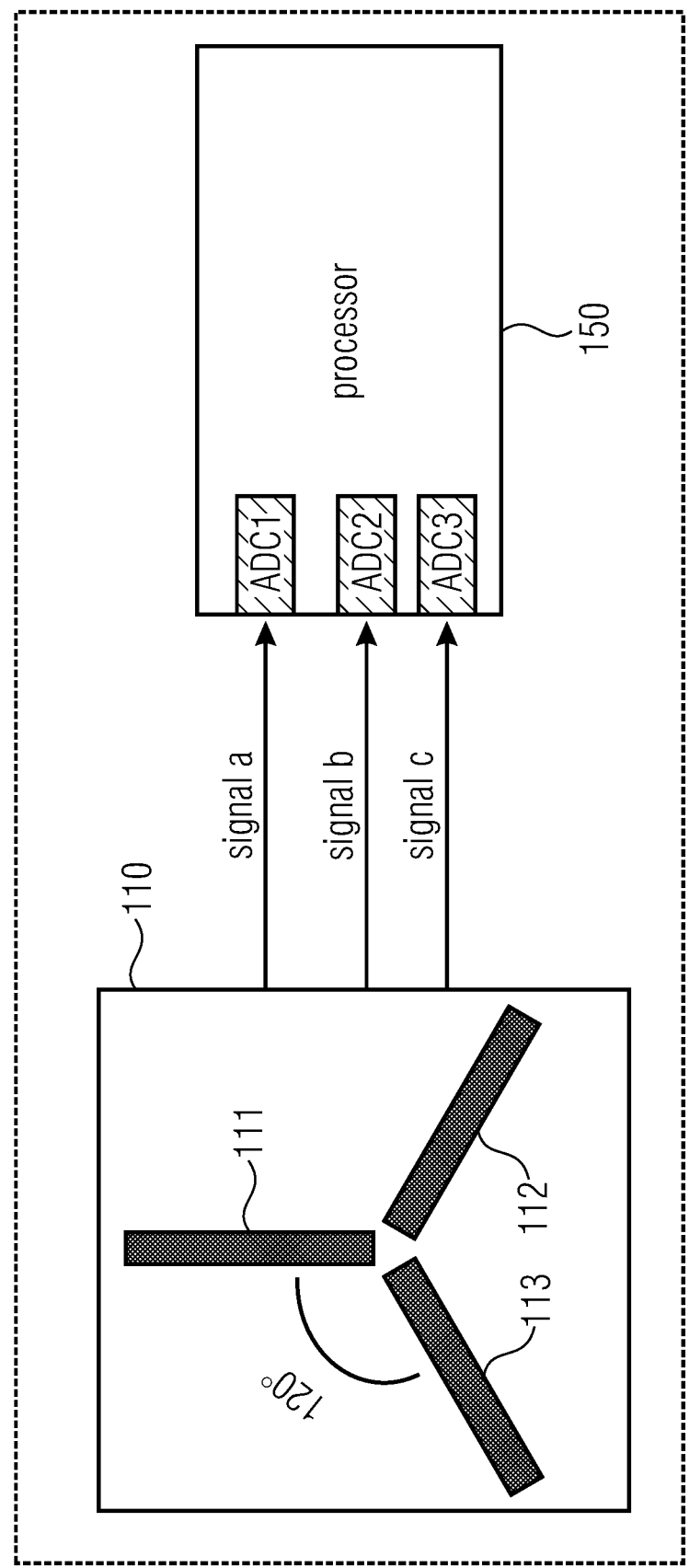
FIG. 7 shows a schematic representation of a possible hardware realization of the magnetic angle sensor according to an implementation.

In turn, if the controller may determine that the criterion according to equation 14 is not fulfilled, then the controller may be configured to derive that the angle calculation of the four angle signals $\alpha_1$, $\alpha_2$, $\alpha_3$, $\alpha_4$ from the three differential signals $d_1$, $d_2$, $d_3$ was not executed correctly. The controller may be configured to derive that the calculation of the differential signals $d_1$, $d_2$, $d_3$ using the single ended signals (a), (b), (c) was incorrect. Furthermore, the controller may be configured to derive that at least one of the magnetoresistive elements 111, 112, 113 does not work properly and that at least one of the magnetoresistive elements 111, 112, 113 generated an invalid signal. Accordingly, the controller may be configured to derive that at least one of the magnetoresistive elements 111, 112, 113 may be faulty. In some implementations, the controller may be configured to determine which one of the magnetoresistive elements 111, 112, 113 may not work properly or may be faulty FIG. 7 shows a possible hardware configuration of the herein described magnetic angle sensor 100. The magnetoresistive arrangement 110 may comprise the above mentioned three magnetoresistive elements 111, 112, 113 being oriented relative to each other such that they form a symmetrical geometric arrangement with equal angular distances between each other, e.g. star topology with 120° equidistant angular distance or equiangular triangle configuration with 60° equidistant angular distance.

The first magnetoresistive element 111 may generate the first analogous output signal (a). The second magnetoresistive element 112 may generate the second analogous output signal (b). The third magnetoresistive element 113 may generate the third analogous output signal (c). The first, second and third analogous output signals (a), (b), (c) may be fed into the controller 150.

The controller 150 may comprise an ADC (Analog-to-Digital Converter) for discretizing the analogous output signals (a), (b), (c). For example, a first Analog-to-Digital Converter 'ADC1' may be configured to convert the first analogous output signal (a) into a first digital output signal, a second Analog-to-Digital Converter 'ADC2' may be configured to convert the second analogous output signal (b) into a second digital output signal, and a third Analog-to-Digital Converter 'ADC3' may be configured to convert the third analogous output signal (c) into a third digital output signal.

The magnetic angle sensor 100 may be realized, as shown in FIG. 7, with the magnetoresistive arrangement 110 being configured as an analogue sensor with an external processor (controller) 150. Alternatively, the magnetic angle sensor 100 may be realized with the magnetoresistive arrangement 110 and the controller 150 being integrated in a single chip with the controller 150 being configured as an integrated DSP (Digital Signal Processor).

Figure 8:
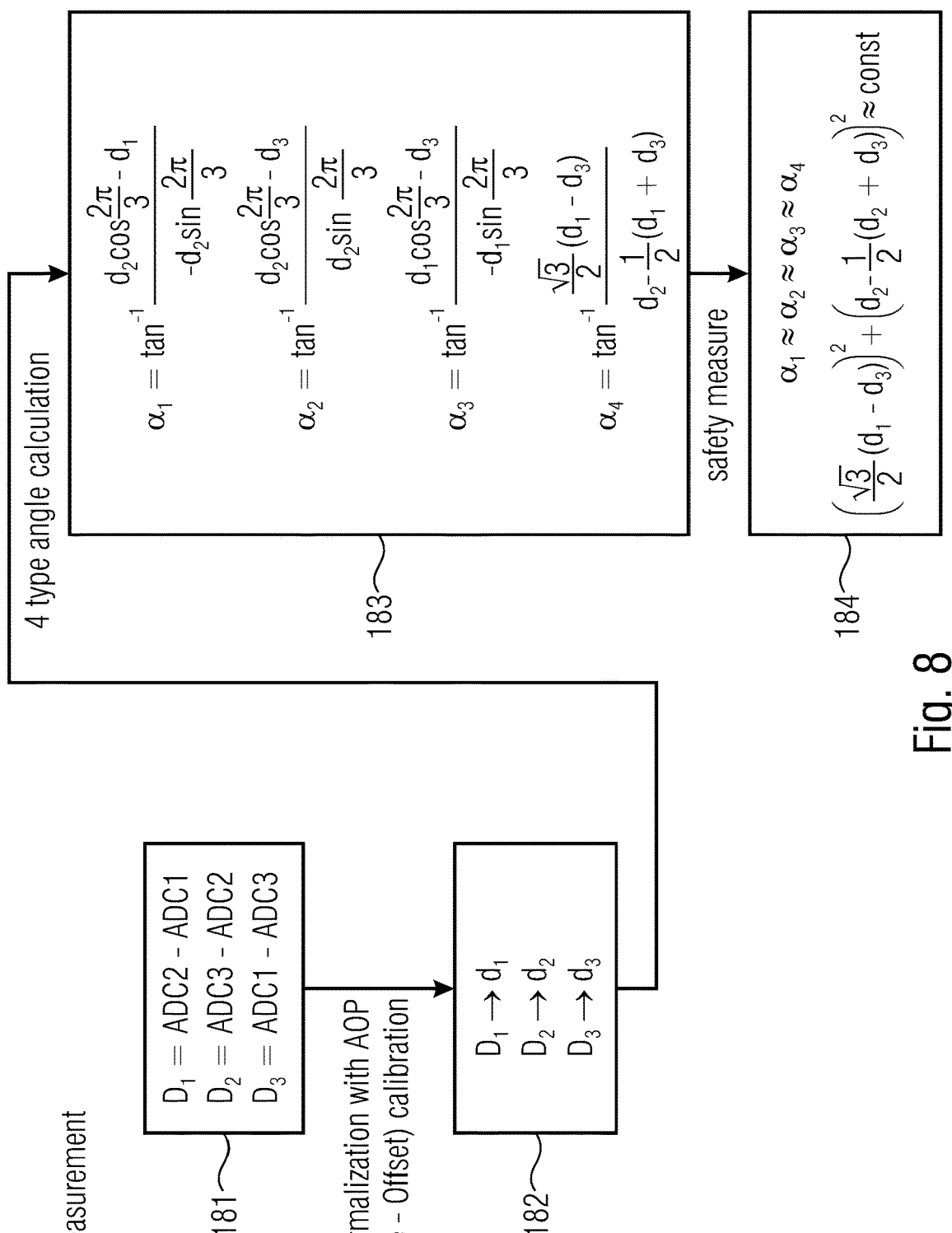
FIG. 8 shows a schematic flow diagram of the herein described innovative principle.

FIG. 8 shows a schematic overview of the herein described innovative principle. This schematic assumes that the magnetic angle sensor 100 is realized, as shown in FIG. 7, with the above described Analog-to-Digital Converters. However, it is also applicable for a single chip with DSP.

In block 181 the differential measurement is performed according to which the three differential signals $d_1$, $d_2$, $d_3$ are calculated from the three single ended signals (a), (b), (c) as described above with reference to equations 1, 2 and 3. As can be seen in block 181, this may be done by using the outputs of the Analog-to-Digital Converters 'ADC1', 'ADC2' and 'ADC3', respectively. In order to emphasize that the three differential signals are not yet normalized, they may be referenced in block 181 with capital letters $D_1$, $D_2$, $D_3$.

Block 181 shows an optional step, wherein the differential signals $D_1$, $D_2$, $D_3$ may be normalized, e.g. by performing an AOP (Amplitude Phase Offset) calibration.

In block 183 the above described at least three, and preferably the above described exactly four, angle signals $\alpha_1$, $\alpha_2$, $\alpha_3$, $\alpha_4$ may be calculated from the three differential signals $d_1$, $d_2$, $d_3$, as described above with reference to equations 4, 5, 6 and 12. These four angle signals $\alpha_1$, $\alpha_2$, $\alpha_3$, $\alpha_4$ may be used as the so-called application angles. That is, these four angle signals $\alpha_1$, $\alpha_2$, $\alpha_3$, $\alpha_4$ may represent and indicate the angular position of the magnetic source 120 relative to the magnetoresistive arrangement 110.

The magnetic angle sensor 100 of the herein described innovative concept may be configured to provide safety integrity check mechanisms for improving its safety integrity levels. Accordingly, in block 184 two different safety measures may be performed, wherein in a first safety measure the calculated angle signals $\alpha_1$, $\alpha_2$, $\alpha_3$, $\alpha_4$ may be compared with each other in order to determine a deviation of at least one of the four angle signals $\alpha_1$, $\alpha_2$, $\alpha_3$, $\alpha_4$, e.g. the controller 150 may be configured to check whether $\alpha_1 \approx \alpha_2 \approx \alpha_3 \approx \alpha_4$.

Additionally or alternatively, in a second safety measure, the differential signals $d_1$, $d_2$, $d_3$ may be used for an additional safety integrity check, wherein the controller 150 may be configured to proof whether the criterion $$\left(\frac{\sqrt{3}}{2}(d_1 - d_3)\right)^2 + \left(d_2 - \frac{1}{2}(d_1 + d_3)\right)^2 \approx \text{constant}$$

is fulfilled.

Figure 9A:
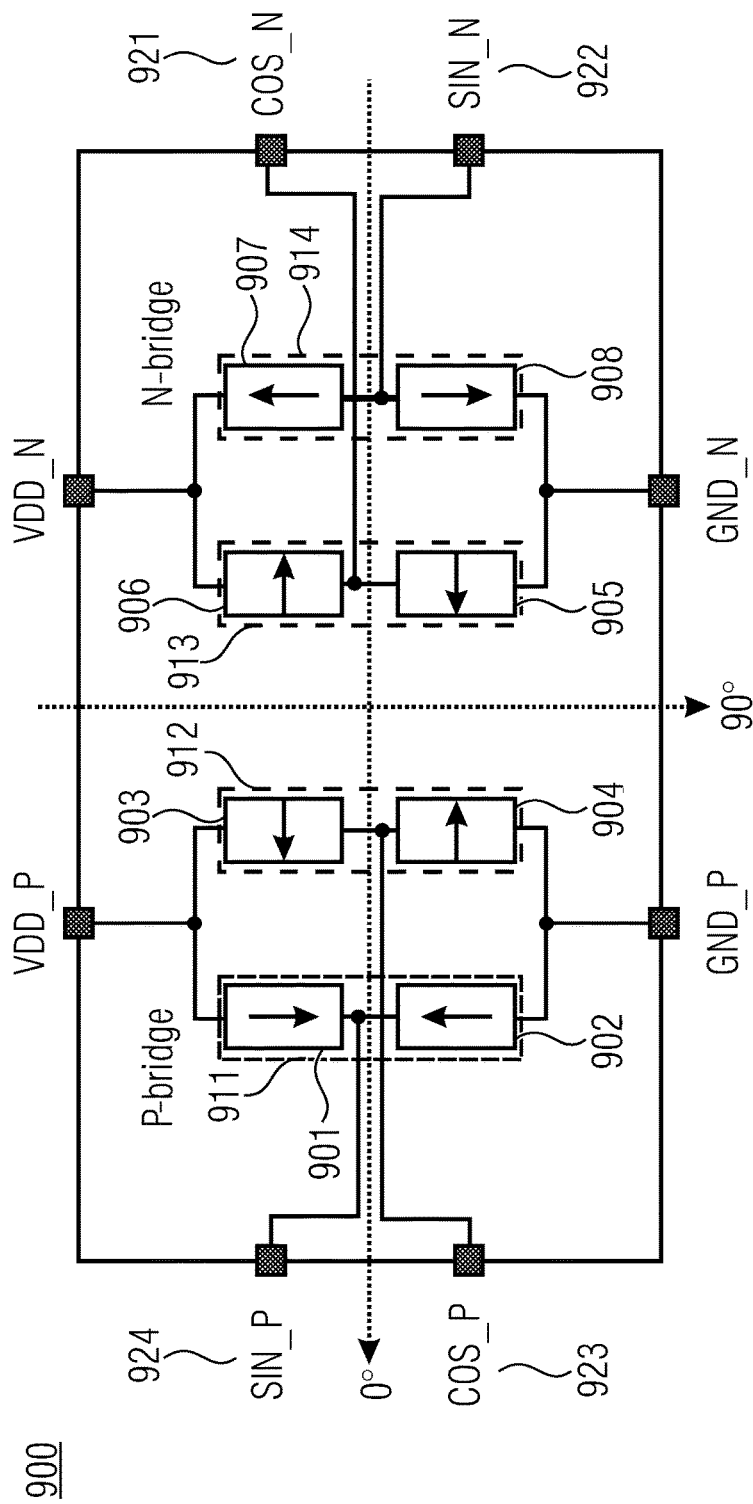
FIGS. 9A and 9B show a schematic comparison between the magnetic angle sensor according to an implementation (FIG. 9B) and an existing TMR-based angle sensor (FIG. 9A)
Figure 9B:
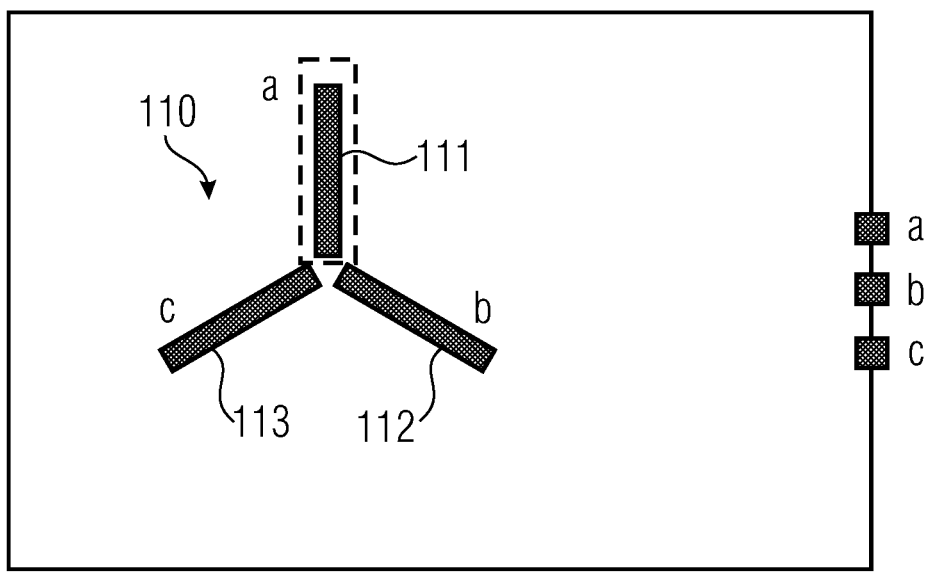

FIGS. 9A and 9B show an overview of the advantages of the herein described innovative magnetic angle sensor 100 (FIG. 9B) compared to existing TMR-based sensors 900 (FIG. 9A).

The existing sensor concept uses four TMR elements 911, 912, 913, 914, wherein each TMR-element comprises a pair of two TMR-stacks 901, . . . , 908. In total, the existing sensor 900 uses eight TMR-stacks 901, . . . , 908. Since four TMR elements 911, 912, 913, 914 are needed, a 4-channel ADC is needed accordingly.

Two TMR elements 911, 912 are connected in a positive bridge connection, while two other TMR elements 913, 914 are connected in a negative bridge connection. Each pair, e.g. each TMR element 911, 912, 913, 914 generates a cos-signal and a sin-signal. Accordingly, the negative bridge generates a negative cos-signal 921 and a negative sin-signal 922, and the positive bridge generates a positive cos-signal 923 and a positive sin-signal 924.

With this existing sensor concept, two differential signals can be generated, namely (SIN-P–COS_P) and (SIN_N–COS_N). Thus, from these two differential signals only one application angle can be calculated. And from the four single ended signals two application angles can be used for safety measures.

The herein described innovative concept instead only uses three magnetoresistive elements 111, 112, 113. Each magnetoresistive element 111, 112, 113 may comprise two magnetoresistive stacks. Thus, only six magnetoresistive stacks are used in the present magnetic angle sensor 100 instead of eight TMR stacks in the existing sensor concept 900.

Since only three magnetoresistive elements 111, 112, 113 are used, a 3-channel ADC is sufficient instead of a 4-channel ADC with the existing sensor concept 900. With the three magnetoresistive elements 111, 112, 113 which are arranged in the symmetric magnetoresistive arrangement 110 as described herein, three differential signals $d_1$, $d_2$, $d_3$ may be generated instead of two differential signals in the existing sensor concept 900.

With the present innovative magnetic angle sensor 100 four application angles $\alpha_1$, $\alpha_2$, $\alpha_3$, $\alpha_4$ can be calculated instead of only one application angle in the existing sensor concept 900. Furthermore, according to the innovative magnetic angle sensor 100, these four angle signals $\alpha_1$, $\alpha_2$, $\alpha_3$, $\alpha_4$ can also be used for safety measurements instead of only two angles in the existing sensor concept 900.

Figure 10:
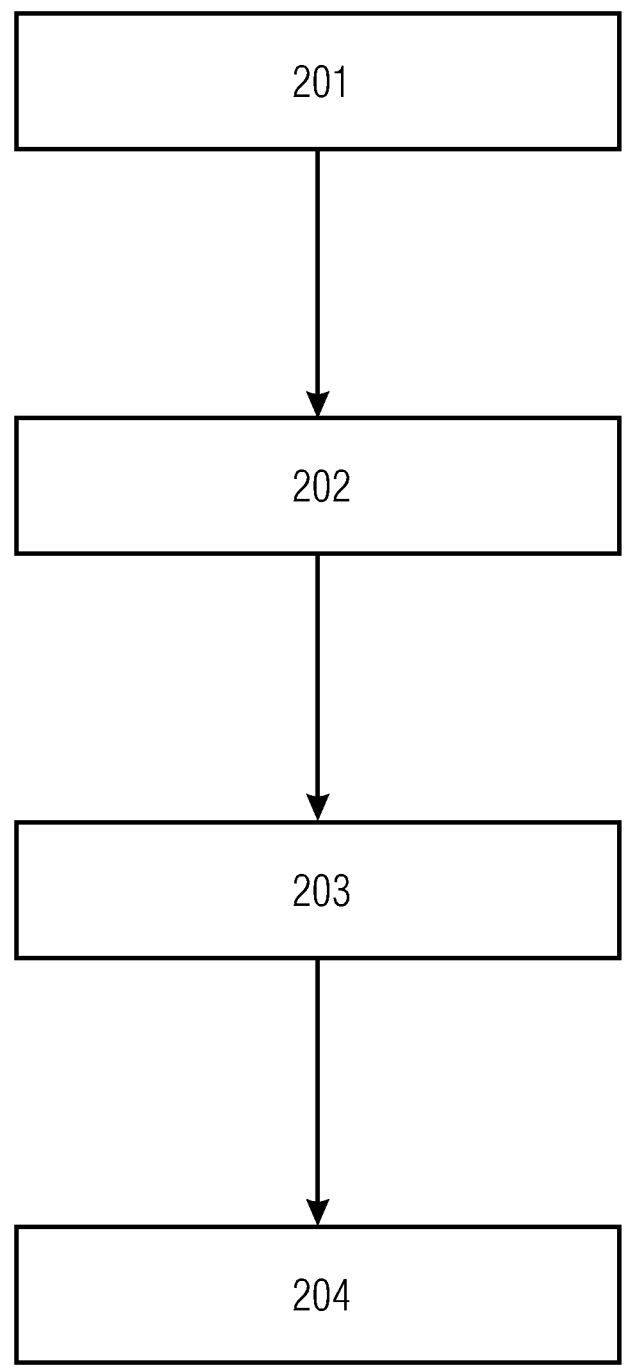
FIG. 10 shows a schematic block diagram of a method for operating a magnetic angle sensor according to an implementation.

FIG. 10 shows a schematic block diagram of a method of operating a magnetic angle sensor 100 according to the herein described innovative principle.

In block 201 a magnetoresistive arrangement 110 is provided with a first, second and third magnetoresistive element 111, 112, 113 being oriented relative to each other such that they form a symmetrical geometric (e.g. star or equiangular triangle) arrangement with equal angular distances between each other.

In block 202 a first single ended output signal (a) is derived from the first magnetoresistive element 111, the first output signal (a) depending on a positional relationship between a magnetic source 120 and the first magnetoresistive element 111. Furthermore, a second single ended output signal (b) is derived from the second magnetoresistive element 112, the second output signal (b) depending on a positional relationship between the magnetic source 120 and the second magnetoresistive element 112. Still further, a third single ended output signal (c) is derived from the third magnetoresistive element 113, the third output signal (c)

depending on a positional relationship between the magnetic source 120 and the third magnetoresistive element 113.

In block 203 three differential signals $d_1$, $d_2$, $d_3$ are determined from the single ended output signals (a), (b), (c), wherein a first differential signal $d_1 = b - a$ is based on a combination of the first output signal (a) and the second output signal (b), a second differential signal $d_2 = c - b$ is based on a combination of the second output signal (b) and the third output signal (c), and a third differential signal $d_3 = a - c$ is based on a combination of the first output signal (a) and the third output signal (c).

In block 204 at least three angle signals $\alpha_1$, $\alpha_2$, $\alpha_3$ are calculated from the three differential signals $d_1$, $d_2$, $d_3$, wherein each of the three angle signals $\alpha_1$, $\alpha_2$, $\alpha_3$ represents a rotational angle of the magnetic source 120 relative to the magnetoresistive arrangement 110, wherein a first angle signal $\alpha_1$ is calculated from the first differential signal $d_1$ and the second differential signal $d_2$, a second angle signal $\alpha_2$ is calculated from the second differential signal $d_2$ and the third differential signal $d_3$, and a third angle signal $\alpha_3$ is calculated from the first differential signal $d_1$ and the third differential signal $d_3$.

As mentioned above, exactly three angle signals $\alpha_1$, $\alpha_2$, $\alpha_3$ or even exactly four angle signals $\alpha_1$, $\alpha_2$, $\alpha_3$, $\alpha_4$ may be calculated from the three differential signals $d_1$, $d_2$, $d_3$. Furthermore, two different safety measures can be performed by checking whether $$\alpha_1 \approx \alpha_2 \approx \alpha_3 \approx \alpha_4$$

and/or by checking whether $$\left(\frac{\sqrt{3}}{2}(d_1 - d_3)\right)^2 + \left(d_2 - \frac{1}{2}(d_1 + d_3)\right)^2 \approx \text{constant}$$

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Some or all of the method steps may be executed by (or using) a hardware apparatus, like for example, a microprocessor, a programmable computer or an electronic circuit. In some implementations, one or more of the most important method steps may be executed by such an apparatus.

Depending on certain implementation requirements, implementations can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some implementations comprise a data carrier having electronically readable control signals, which are capable of cooperating with a programmable computer system, such that one of the methods described herein is performed.

Generally, implementations can be implemented as a computer program product with a program code, the program code being operative for performing one of the methods when the computer program product runs on a computer. The program code may for example be stored on a machine readable carrier.

Other implementations comprise the computer program for performing one of the methods described herein, stored on a machine readable carrier.

In other words, an implementation of the inventive method is, therefore, a computer program having a program code for performing one of the methods described herein, when the computer program runs on a computer.

A further implementation of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further implementation of the inventive method is, therefore, a data stream or a sequence of signals representing the computer program for performing one of the methods described herein. The data stream or the sequence of signals may for example be configured to be transferred via a data communication connection, for example via the Internet.

A further implementation comprises a processing means, for example a computer, or a programmable logic device, configured to or adapted to perform one of the methods described herein.

A further implementation comprises a computer having installed thereon the computer program for performing one of the methods described herein.

A further implementation comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some implementations, a programmable logic device (for example a field programmable gate array) may be used to perform some or all of the functionalities of the methods described herein. In some implementations, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

While this disclosure has been described with reference to illustrative implementations, this description is not intended to be construed in a limiting sense. Various modifications and combinations of the illustrative implementations, as well as other implementations of this disclosure, will be apparent to persons skilled in the art upon reference to the description. It is therefore intended that the appended claims encompass any such modifications or implementations.

What is claimed is:

1. A magnetic angle sensor comprising:
   a magnetoresistive arrangement and a magnetic source configured to be movable relative to the magnetoresistive arrangement, the magnetoresistive arrangement comprising:

a first magnetoresistive element configured to generate a first output signal depending on a positional relationship between the magnetic source and the first magnetoresistive element, a second magnetoresistive element configured to generate a second output signal depending on a positional relationship between the magnetic source and the second magnetoresistive element, and a third magnetoresistive element configured to generate a third output signal depending on a positional relationship between the magnetic source and the third magnetoresistive element, wherein the first magnetoresistive element, the second magnetoresistive element, and the third magnetoresistive element are oriented relative to each other such that the first magnetoresistive element, the second magnetoresistive element, and the third magnetoresistive element form a symmetrical geometric arrangement with equal angular distances between each other; and a controller configured to:

determine three differential signals, wherein a first differential signal is based on a combination of the first output signal and the second output signal, a second differential signal is based on a combination of the second output signal and the third output signal, and a third differential signal is based on a combination of the first output signal and the third output signal, calculate three angle signals from the three differential signals, wherein each of the three angle signals represents a rotational angle of the magnetic source relative to the magnetoresistive arrangement, and calculate a first angle signal from a combination of the first differential signal and the second differential signal, calculate a second angle signal from a combination of the second differential signal and the third differential signal, and calculate a third angle signal from a combination of the first differential signal and the third differential signal.

2. The magnetic angle sensor according to claim 1, wherein the first magnetoresistive element, the second magnetoresistive element, and the third magnetoresistive element are arranged in a symmetrical star arrangement with an angular distance of 120° between each other.

3. The magnetic angle sensor according to claim 1, wherein the first magnetoresistive element, the second magnetoresistive element, and the third magnetoresistive element are arranged in a symmetrical equiangular triangle arrangement with an angular distance of 60° between each other.

4. The magnetic angle sensor according to claim 1, wherein the controller is configured to conduct a safety measure based on the first angle signal, the second angle signal, and the third angle signal by comparing the first angle signal, the second angle signal, and the third angle signal with each other and to determine whether the first angle signal, the second angle signal, and the third angle signal are equal or whether the first angle signal, the second angle signal, and the third angle signal deviate from each other.

5. The magnetic angle sensor according to claim 4, wherein if the controller determines that one of the first angle signal, the second angle signal, and the third angle signal deviates by a certain amount from other ones of the first angle signal, the second angle signal, and the third angle signal, then the controller is configured to detect, based on the determined deviating angle signal, one or more of:

that one of the first magnetoresistive element, the second magnetoresistive element, and the third magnetoresistive element generates a faulty output signal, or which one of the first magnetoresistive element, the second magnetoresistive element, and the third magnetoresistive element generates a faulty output signal.

6. The magnetic angle sensor according to claim 1, wherein the controller is configured to calculate a fourth angle signal from a combination of the first differential signal and the second differential signal and the third differential signal.

7. The magnetic angle sensor according to claim 6, wherein the controller is configured to compare the first angle signal, the second angle signal, the third angle signal, and the fourth angle signal with each other and to determine whether the first angle signal, the second angle signal, the third angle signal, and the fourth angle signal are equal or whether the first angle signal, the second angle signal, the third angle signal, and the fourth angle signal deviate from each other.

8. The magnetic angle sensor according to claim 7, wherein if the controller determines that one of the first angle signal, the second angle signal, the third angle signal, and the fourth angle signal deviates by a certain amount from other ones of the first angle signal, the second angle signal, the third angle signal, and the fourth angle signal, then the controller is configured to determine, based on the determined deviating angle signal, one or more of:

that one of the first magnetoresistive element, the second magnetoresistive element, and the third magnetoresistive element generates a faulty output signal, or which one of the first magnetoresistive element, the second magnetoresistive element, and the third magnetoresistive element generates a faulty output signal.

9. The magnetic angle sensor according to claim 6, wherein the controller is configured to conduct a safety measure based on the first differential signal, the second differential signal, and the third differential signal, by checking whether a sum of a first quadratic term containing the first differential signal and the third differential signal and a second quadratic term containing the first differential signal and the second differential signal, and the third differential signal is constant.

10. The magnetic angle sensor according to claim 9, wherein the controller is configured to conduct the safety measure based on the following equation $$\left(\frac{\sqrt{3}}{2}(d_1 - d_3)\right)^2 + \left(d_2 - \frac{1}{2}(d_1 + d_3)\right)^2 \approx \text{constant}$$

wherein $d_1$ represents the first differential signal, $d_2$ represents the second differential signal, and $d_3$ represents the third differential signal.

11. The magnetic angle sensor according to claim 1,
wherein the first magnetoresistive element, the second magnetoresistive element, and the third magnetoresistive element comprise at least one of:
a TMR-device (TMR: Tunnel Magnetoresistance),
a GMR-device (GMR: Giant Magnetoresistance),
a CMR-device (CMR: Colossal Magnetoresistance),
an EMR-device (EMR: Extraordinary Magnetoresistance), or
an AMR-device (AMR: Anisotropic Magnetoresistance).

12. A method for operating a magnetic angle sensor, the method comprising steps of:
providing a magnetoresistive arrangement with a first magnetoresistive element, a second magnetoresistive element, and a third magnetoresistive element, the first magnetoresistive element, the second magnetoresistive element, and the third magnetoresistive element being oriented relative to each other such that the first magnetoresistive element, the second magnetoresistive element, and the third magnetoresistive element form a symmetrical geometric arrangement with equal angular distances between each other,
deriving from the first magnetoresistive element a first output signal depending on a positional relationship between a magnetic source and the first magnetoresistive element,
deriving from the second magnetoresistive element a second output signal depending on a positional relationship between the magnetic source and the second magnetoresistive element,
deriving from the third magnetoresistive element a third output signal depending on a positional relationship between the magnetic source and the third magnetoresistive element,
determining three differential signals from the first output signal, the second output signal, and the third output signal, wherein
a first differential signal is based on a combination of the first output signal and the second output signal,
a second differential signal is based on a combination of the second output signal and the third output signal, and
a third differential signal is based on a combination of the first output signal and the third output signal, and
calculating at least three angle signals from the three differential signals, wherein each of the three angle signals represents a rotational angle of the magnetic source relative to the magnetoresistive arrangement, wherein
a first angle signal is calculated from the first differential signal and the second differential signal,
a second angle signal is calculated from the second differential signal and the third differential signal, and
a third angle signal is calculated from the first differential signal and the third differential signal.

13. The method of claim 12, wherein the first magnetoresistive element, the second magnetoresistive element, and the third magnetoresistive element are arranged in a symmetrical star arrangement.

14. The method of claim 12, wherein the first magnetoresistive element, the second magnetoresistive element, and the third magnetoresistive element are arranged in a symmetrical equiangular triangle arrangement.

15. A non-transitory computer-readable medium having stored thereon a computer program having a program code, that, when executed by one or more processors of a device, causes the device to:
provide a magnetoresistive arrangement with a first magnetoresistive element, a second magnetoresistive element, and a third magnetoresistive element, the first magnetoresistive element, the second magnetoresistive element, and the third magnetoresistive element being oriented relative to each other such that the first magnetoresistive element, the second magnetoresistive element, and the third magnetoresistive element form a symmetrical geometric arrangement with equal angular distances between each other;
derive from the first magnetoresistive element a first output signal depending on a positional relationship between a magnetic source and the first magnetoresistive element;
derive from the second magnetoresistive element a second output signal depending on a positional relationship between the magnetic source and the second magnetoresistive element;
derive from the third magnetoresistive element a third output signal depending on a positional relationship between the magnetic source and the third magnetoresistive element;
determine three differential signals from the first output signal, the second output signal, and the third output signal, wherein
a first differential signal is based on a combination of the first output signal and the second output signal,
a second differential signal is based on a combination of the second output signal and the third output signal, and
a third differential signal is based on a combination of the first output signal and the third output signal;
and calculate at least three angle signals from the three differential signals, wherein each of the three angle signals represents a rotational angle of the magnetic source relative to the magnetoresistive arrangement, wherein
a first angle signal is calculated from the first differential signal and the second differential signal,
a second angle signal is calculated from the second differential signal and the third differential signal, and
a third angle signal is calculated from the first differential signal and the third differential signal.

16. The non-transitory computer-readable medium of claim 15, wherein the first magnetoresistive element, the second magnetoresistive element, and the third magnetoresistive element are arranged in a symmetrical star arrangement with an angular distance of 120° between each other.

17. The non-transitory computer-readable medium of claim 15, wherein the first magnetoresistive element, the second magnetoresistive element, and the third magnetoresistive element are arranged in a symmetrical star arrangement with an angular distance of 60° between each other.

18. The non-transitory computer-readable medium of claim 15, wherein the program code, when executed by the one or more processors, causes the device further to:
conduct a safety measure based on the first angle signal, the second angle signal, and the third angle signal by comparing the first angle signal, the second angle signal, and the third angle signal with each other and to determine whether the first angle signal, the second angle signal, and the third angle signal are equal or whether the first angle signal, the second angle signal, and the third angle signal deviate from each other.

19. The non-transitory computer-readable medium of claim 15, wherein the program code, when executed by the one or more processors, causes the device further to:
conduct a safety measure based on the first angle signal, the second angle signal, and the third angle signal.

20. The non-transitory computer-readable medium of claim 15, wherein the program code, when executed by the one or more processors, causes the device further to:
detect a faulty output signal based on the first angle signal, the second angle signal, and the third angle signal.

* * * * *